United States Patent
Gurin et al.

(10) Patent No.: US 11,543,229 B2
(45) Date of Patent: *Jan. 3, 2023

(54) SENSOR MISALIGNMENT MEASURING DEVICE

(71) Applicant: INVENSENSE, INC., San Jose, CA (US)

(72) Inventors: Ilya Gurin, Mountain View, CA (US); Leonardo Baldasarre, Gavirate (IT)

(73) Assignee: INVENSENSE, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/225,464

(22) Filed: Apr. 8, 2021

(65) Prior Publication Data

US 2021/0223024 A1 Jul. 22, 2021

Related U.S. Application Data

(60) Continuation of application No. 16/750,650, filed on Jan. 23, 2020, now Pat. No. 11,002,527, which is a
(Continued)

(51) Int. Cl.
*G01B 7/31* (2006.01)
*G01B 7/00* (2006.01)
(Continued)

(52) U.S. Cl.
CPC ............ *G01B 7/003* (2013.01); *G01B 7/305* (2013.01); *G01B 7/31* (2013.01); *H01L 22/34* (2013.01); *G01D 5/2412* (2013.01); *H01L 22/14* (2013.01)

(58) Field of Classification Search
CPC .......... G01B 7/003; G01B 7/305; G01B 7/31; G01D 5/2412; H01L 22/14; H01L 22/34;
(Continued)

(56) References Cited

U.S. PATENT DOCUMENTS 5,083,383 A   1/1992  Heger
5,699,282 A  12/1997  Allen et al.
(Continued)

FOREIGN PATENT DOCUMENTS

CN   104517869 A   4/2015
CN   106153087 A  11/2016

OTHER PUBLICATIONS

Chinese Office Action for Chinese Application Serial No. 201880066758.1 dated Mar. 1, 2021, 10 pages.
(Continued)

*Primary Examiner* — Vinh P Nguyen
(74) *Attorney, Agent, or Firm* — Amin, Turocy & Watson, LLP

(57) ABSTRACT

The present disclosure relates to measuring misalignment between layers of a semiconductor device. In one embodiment, a device includes a first conductive layer; a second conductive layer; one or more first electrodes embedded in the first conductive layer; one or more second electrodes embedded in the second conductive layer; a sensing circuit connected to the one or more first electrodes; and a plurality of time-varying signal sources connected to the one or more second electrodes, wherein the one or more first electrodes and the one or more second electrodes form at least a portion of a bridge structure that exhibits an electrical property that varies as a function of misalignment of the first conductive layer and the second conductive layer in an in-plane direction.

20 Claims, 19 Drawing Sheets

Related U.S. Application Data division of application No. 15/783,792, filed on Oct. 13, 2017, now Pat. No. 10,634,483.

(51) Int. Cl.
    *G01B 7/305*    (2006.01)
    *H01L 21/66*    (2006.01)
    *G01D 5/241*    (2006.01)

(58) Field of Classification Search
CPC ... H01L 25/0657; H01L 23/645; H01L 25/50; H01L 2924/30105; H01L 2225/06593; H01L 2924/30107; H01L 2924/0002; H01L 2223/54426; H01L 2924/19042; H01L 2924/14; H01L 2924/19041; H01L 2924/00; B81C 3/004; B81C 2201/019; B81C 2203/051; B81B 2207/017

See application file for complete search history.

(56) References Cited

U.S. PATENT DOCUMENTS

| | | | |
|---|---|---|---|
| 6,143,621 A | 11/2000 | Tzeng et al. | |
| 6,305,095 B1 | 10/2001 | Look et al. | |
| 6,614,051 B1 | 9/2003 | Ma | |
| 6,647,311 B1 | 11/2003 | Goff | |
| 7,193,423 B1 | 3/2007 | Dalton et al. | |
| 7,838,313 B2 | 11/2010 | Arthur et al. | |
| 7,902,833 B2 * | 3/2011 | Lin | G01R 19/16566 324/522 |
| 7,902,837 B2 | 3/2011 | Rousseau et al. | |
| 8,482,437 B1 | 7/2013 | Hua et al. | |
| 9,147,636 B2 | 9/2015 | Canegallo et al. | |
| 9,818,661 B2 * | 11/2017 | Tomita | G01R 31/2884 |
| 9,952,252 B2 * | 4/2018 | Thompson | B81B 3/0086 |
| 10,698,323 B2 | 6/2020 | Huang | |
| 2010/0193786 A1 | 8/2010 | Kim | |
| 2015/0091603 A1 | 4/2015 | Tomita et al. | |

OTHER PUBLICATIONS

Chinese Office Action for Chinese Application Serial No. 201880066758.1 dated Nov. 25, 2021, 4 pages.
Comunication Pursuant to Article 94(3) EPC received for European Application No. 18796275.8 dated Nov. 10, 2021, 5 pages.
Chinese Office Action for Chinese Application No. 2018800667581 dated Jul. 23, 2021.
Non Final office action received for U.S. Appl. No. 15/783,792 dated May 22, 2019, 13 pages.
Notice of Allowance received for U.S. Appl. No. 15/783,792 dated Dec. 23, 2019, 22 pages.
International seacrh report and written opinion received for PCT application serial No. PCT/US2018/055503 dated Dec. 12, 2018, 10 pages.
Comunication Pursuant to Rules 161(1) and 162 EPC received for European Application No. 18796275.8 dated May 20, 2020, 3 pages.
Non Final office action received for U.S. Appl. No. 16/750,650 dated Sep. 25, 2020, 26 pages.
Notice of Allowance received for U.S. Appl. No. 16/750,650 dated Jan. 27, 2021, 29 pages.
First search received for Chinese patent application serial No. 2018800667581 dated Feb. 22, 2021, 2 pages.
Office Action received for Taiwan Patent Application Serial No. 107136005 dated Apr. 11, 2022, 10 pages.
Notice of Allowance received for Taiwan Patent App. Serial No. 107136005 dated Sep. 5, 2022, 2 pages.

\* cited by examiner

SENSOR MISALIGNMENT MEASURING DEVICE

CROSS-REFERENCE TO RELATED APPLICATION

This patent application is a continuation of, and claims priority to, U.S. patent application Ser. No. 16/750,650, filed on Jan. 23, 2020, and entitled "IN-PLANE SENSOR MISALIGNMENT MEASURING DEVICE USING CAPACITIVE SENSING," which is a divisional application of, and claims priority to, U.S. patent application Ser. No. 15/783,792, filed on Oct. 13, 2017, and entitled "SENSOR MISALIGNMENT MEASURING DEVICE," each of which are incorporated by reference in their entirety herein.

BACKGROUND

Certain sensor devices (e.g., accelerometers, gas sensors, etc.) are designed to accommodate a given amount of misalignment between conductive device layers and/or other component parts of the device. If the design is not implemented correctly, or if the actual misalignment between components exceeds the accommodated amount, performance and/or reliability problems can result. Accordingly, it would be desirable to implement techniques for measuring misalignment on a fabricated device.

SUMMARY

The following presents a simplified summary of one or more of the embodiments of the present disclosure in order to provide a basic understanding the embodiments. This summary is not an extensive overview of the embodiments described herein. It is intended to neither identify key or critical elements of the embodiments nor delineate any scope of embodiments or the claims. This Summary's sole purpose is to present some concepts of the embodiments in a simplified form as a prelude to the more detailed description that is presented later. It will also be appreciated that the detailed description may include additional or alternative embodiments beyond those described in the Summary section.

The present disclosure recognizes and addresses, in at least certain embodiments, the issue of detecting misalignment in a semiconductor device, e.g., a sensor device. Various semiconductor devices can include multiple layers formed or otherwise placed onto each other. If the design of the device is incorrect, or if the misalignment between layers exceeds a tolerated amount, performance and/or reliability issues can result. The disclosed systems and methods provide for a misalignment sensor that can be incorporated into a semiconductor device to enable a fast, nondestructive measurement of misalignment. The disclosed misalignment sensor can be readily integrated with existing semiconductor structures with minimal additional area or circuits.

In one aspect disclosed herein, a device includes a first conductive layer, a second conductive layer, one or more first electrodes embedded in the first conductive layer, one or more second electrodes embedded in the second conductive layer, a sensing circuit connected to the one or more first electrodes, and a plurality of time-varying signal sources connected to the one or more second electrodes. The one or more first electrodes and the one or more second electrodes forms at least a portion of a bridge structure that exhibits an electrical property that varies as a function of misalignment of the first conductive layer and the second conductive layer in an in-plane direction.

Other embodiments and various examples, scenarios and implementations are described in more detail below. The following description and the drawings set forth certain illustrative embodiments of the specification. These embodiments are indicative, however, of but a few of the various ways in which the principles of the specification may be employed. Other advantages and novel features of the embodiments described will become apparent from the following detailed description of the specification when considered in conjunction with the drawings.

DETAILED DESCRIPTION

The present disclosure recognizes and addresses, in at least certain embodiments, the issue of detecting misalignment in a semiconductor device. Various semiconductor devices can include multiple layers formed or otherwise placed onto each other. If the design of the semiconductor device is incorrect, or if the misalignment between layers exceeds a tolerated amount, performance and/or reliability issues can result. The disclosed systems and methods provide for a misalignment sensor that can be incorporated into a semiconductor device to enable a fast, nondestructive measurement of misalignment. The disclosed misalignment sensor can be readily integrated with existing semiconductor structures with minimal additional area or circuits.

Figure 1:
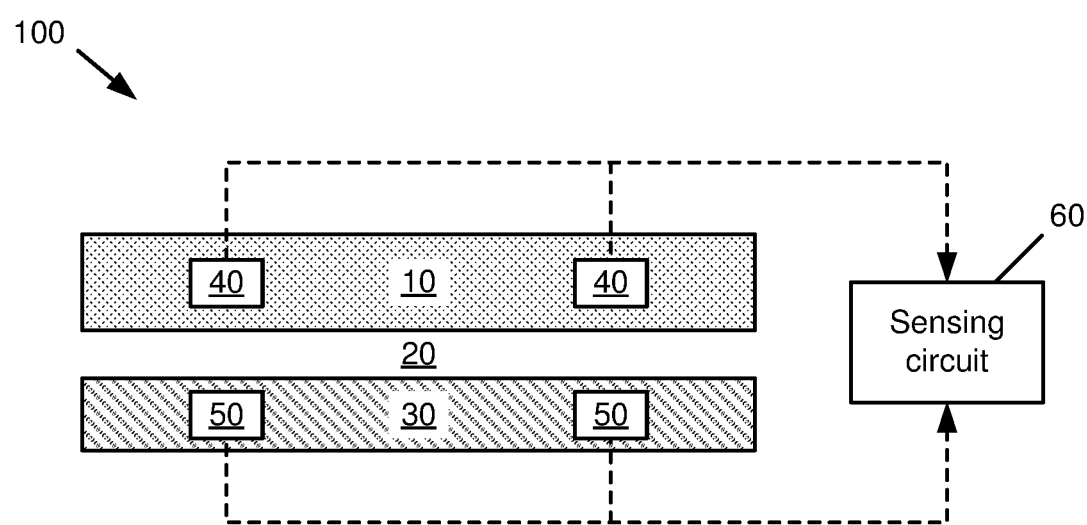
FIG. 1 is a high-level block diagram of a system for measuring misalignment between respective layers of a semiconductor device in accordance with one or more embodiments of the disclosure.

With reference to the drawings, FIG. 1 depicts a system 100 for measuring misalignment between respective layers of a semiconductor device in accordance with one or more embodiments of the disclosure. As illustrated, the system 100 includes a semiconductor device that includes a first conductive layer 10, an intermediate layer 20, and a second conductive layer 30. The layers are formed and/or otherwise positioned as shown in system 100 such that a first (e.g., top) surface of the intermediate layer 20 is situated adjacent to a first (e.g., bottom) surface of the first conductive layer 10 and a second (e.g., bottom) surface of the intermediate layer 20 opposite the first surface is situated adjacent to a first (e.g., top) surface of the second conductive layer 30. While the layers 10, 20, 30 shown in system 100 are oriented from top to bottom in a stack configuration, it should be appreciated that the layers 10, 20, 30 of system 100 could be oriented in any other suitable configuration, e.g., the second conductive layer 30 could be situated above the intermediate layer 20 and the first conductive layer 10 could be situated below the intermediate layer 20. Other configurations are also possible.

In various embodiments, the intermediate layer 20 can be either a conductive layer or a nonconductive layer in order to support the particular sensing method and associated electrical properties utilized by a given implementation. Respective embodiments utilizing conductive and nonconductive intermediate layers are described in further detail below.

As further shown by FIG. 1, the first conductive layer 10 has embedded therein one or more first electrodes 40, and the second conductive layer 30 has embedded therein one or more second electrodes 50. While two first electrodes 40 and two second electrodes 50 are illustrated in FIG. 1, it should be appreciated that each of the conductive layers 10, 30 could have embedded therein any suitable number of electrodes. The electrical connections between the one or more first electrodes 40 and the one or more second electrodes 50 form a suitable network (e.g., a single-ended network, a half bridge, or a full bridge) that exhibits an electrical property (e.g., capacitance, electrical charge, conductance, etc.) that varies as a function of misalignment of the first conductive layer 10 and the second conductive layer 30 in an in-plane direction.

In an aspect, the electrodes 40, 50 are electrically coupled to a sensing circuit 60, which can be an electrical circuit and/or any other suitable means for measuring the electrical property of the electrodes 40, 50. The sensing circuit 60, in various embodiments, can be a single-ended sensing circuit, a differential sensing circuit, and/or any other component(s) suitable for measuring the electrical property of the network formed by one or more of the electrodes 40, 50 or their respective associated layers 10, 30.

In some embodiments, system 100 can be, or incorporate the functionality of at least a portion of a sensor device such as an accelerometer, a gas sensor, a temperature sensor, a pressure sensor, or the like. In an aspect, a sensor device can be composed of one or more layers 10, 20, 30, as shown in FIG. 1 and described above, that are bonded together according to one or more semiconductor fabrication techniques. The composition of the layers 10, 20, 30, for a particular sensor device can vary based on the desired functionality of the device and/or other factors. In one example, the first conductive layer 10 can be a layer of a micro-electro-mechanical system (MEMS) wafer, and the second conductive layer 30 can be a layer of a complementary metal-oxide-semiconductor (CMOS) wafer, or vice versa. Other layer types could also be employed.

Figure 2:
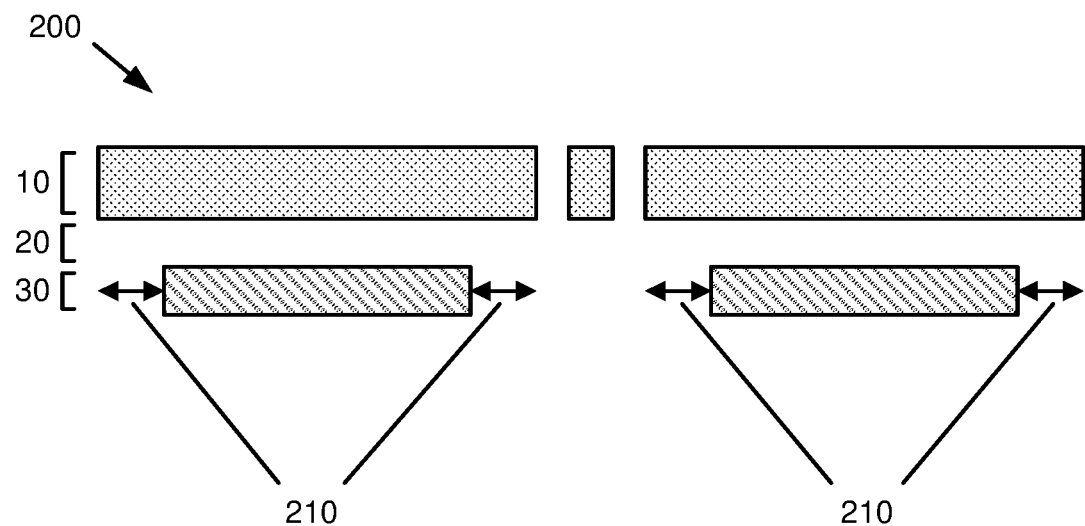
FIG. 2 depicts example layer misalignment in a semiconductor device that can be detected by the system of FIG. 1.
Figure 2:
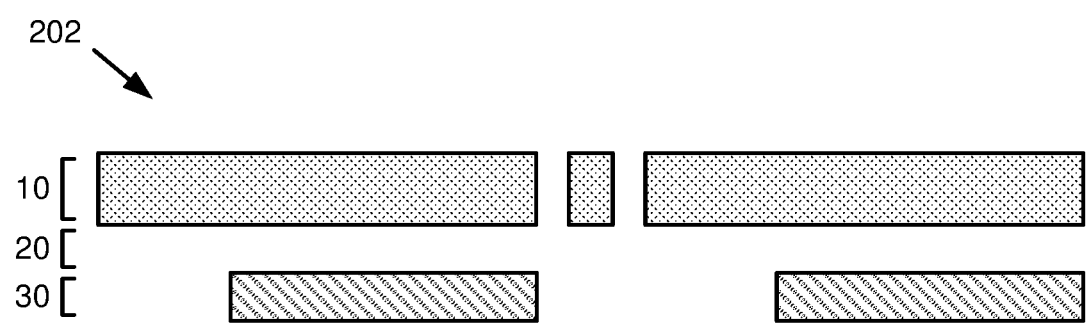

In an aspect, a sensor device composed of layers 10, 20, 30 can be designed to accommodate a given amount of misalignment. Turning to FIG. 2, cross-sectional diagrams 200 and 202 illustrate a semiconductor device having layers 10, 20, 30, where layers 10 and 30 are subject to a misalignment tolerance 210. In one non-limiting example, the misalignment tolerance 210 shown in diagram 200 corresponds to a maximum misalignment that results in respective features of layers 10 and 30 being aligned to each other to within an acceptable degree. For instance, cross-sectional diagram 202 in FIG. 2 illustrates a scenario in which a given component of the first conductive layer 10 is aligned with a corresponding component of the second conductive layer 30 at an edge of the two components such that any further misalignment between the conductive layers 10, 30 would result in the components no longer being fully aligned. It should be appreciated, however, that the preceding is merely a non-limiting example of a misalignment tolerance 210 that could be used and that other misalignment tolerances are also possible.

Misalignment between layers of a semiconductor device as shown by diagrams 200, 202 can occur due to imprecision in fabrication processes and/or other factors. Prior to fabrication of a given semiconductor device, the allowable misalignment can be specified with the foundry and/or other fabrication facility. If the design is not done correctly, or if the actual misalignment of the device as fabricated exceeds this specification, performance and/or reliability problems can result. However, conventional techniques for measuring misalignment on a fabricated device can be time-consuming and/or costly. This means that if performance or reliability problems are observed, it can be difficult to confirm or rule out misalignment as a possible cause. This also means that it can be difficult to monitor the foundry's compliance with the misalignment specification.

In an aspect, the electrodes 40, 50 and the sensing circuit 60 shown in FIG. 1 operate as a misalignment sensor, e.g., a structure that can be included on a device die to enable a fast, nondestructive measurement of misalignment. This structure, according to various embodiments described below, can be readily integrated with semiconductor devices such as sensors with minimal associated MEMS area overhead, additional CMOS circuits, or the like.

In an aspect, a semiconductor misalignment sensor as described herein can be implemented for a semiconductor structure such as the structure shown by diagrams 200, 202 in FIG. 2. In one example, components of the misalignment sensor can include a MEMS structure including three pieces of silicon arranged in a side-by-side manner and connected to respective nodes, e.g., as shown by the structure of layer 10 in diagrams 200, 202. The misalignment sensor can further include and/or be associated with a CMOS structure including one or more electrodes (e.g., 1 or 2 electrodes) arranged underneath the MEMS structure, e.g., as shown by the structure of layer 30 in diagrams 200, 202. In this configuration, the structure can function by measuring an electrical property (e.g., capacitance, electrical charge, electrical conductance, etc.) between the CMOS structure and the MEMS structure. An electrical input (e.g., a constant voltage, an oscillating voltage provided as a sine wave, square wave, or the like, etc.) is applied to one or more nodes associated with the sensor, and the current or voltage output is measured at one or more different nodes.

While the above description and various ones of the embodiments described herein utilize a MEMS layer and a CMOS layer, it should be appreciated that other configurations could also be used. For instance, a misalignment sensor as described herein could be utilized to measure misalignment between two or more CMOS layers (e.g., CMOS interconnect layers), two or more MEMS layers, and/or any other combination of CMOS, MEMS, and/or other layers that can be implemented via a semiconductor device.

Turning now to FIGS. 3-22, respective configurations of a misalignment sensor that can be implemented according to one or more embodiments described herein are illustrated. It should be appreciated, however, that the configurations depicted by FIGS. 3-22 comprise merely a non-exhaustive listing of sensor configurations that can be utilized and that other configurations are also possible. Further, while respective ones of FIGS. 3-22 are illustrated in the context of specific layer configurations and/or types, it should additionally be appreciated that, unless stated otherwise, similar configurations to those illustrated could be employed for other layer types and/or configurations without departing from the scope of the embodiments described herein.

In the following descriptions, respective embodiments are illustrated and described with reference first to a simplified schematic diagram of the sensing techniques used by the respective embodiments followed by one or more cross-sectional diagrams that can be utilized to implement a sensing circuit as illustrated in the schematic diagram. It should be appreciated, however, that the cross-sectional diagrams shown and described herein are merely examples of structures that can be utilized and that other structures could also be used.

Figure 3:
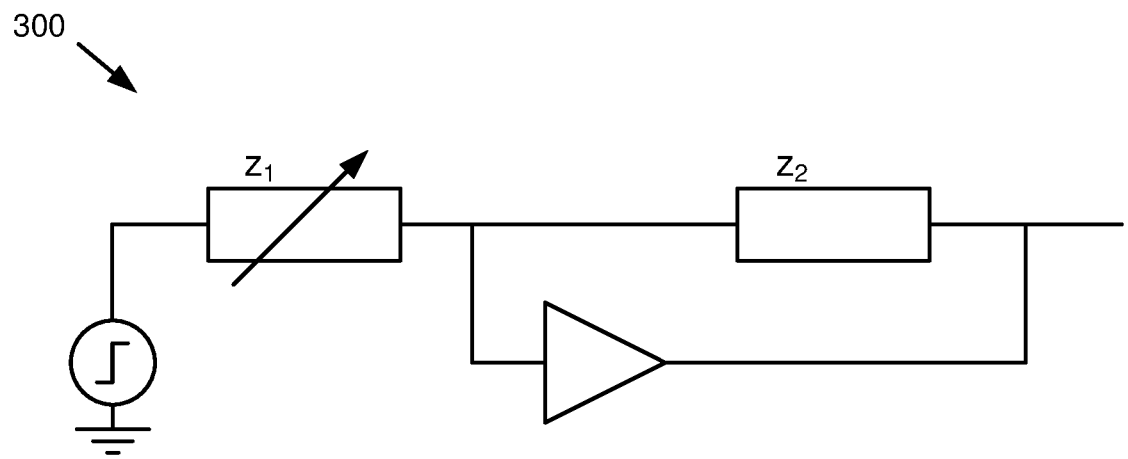
FIG. 3 is a simplified schematic diagram of a single-ended sensing circuit with single-ended input sensing that can be utilized by various embodiments described herein.

With reference first to FIG. 3, a simplified schematic diagram of a single-ended sensing circuit 300 with single-ended input sensing is provided. As shown in FIG. 3 and the figures that follow, the arrows represent an impedance (e.g., overlap) change due to misalignment. Here, an applied input voltage results in an output voltage. The output voltage is used to calculate impedance $Z_1$, which is used in turn to calculate the extent of misalignment, if any, between the layers of the associated device, e.g., layers 10 and 30 as shown in FIG. 1.

Figure 4:
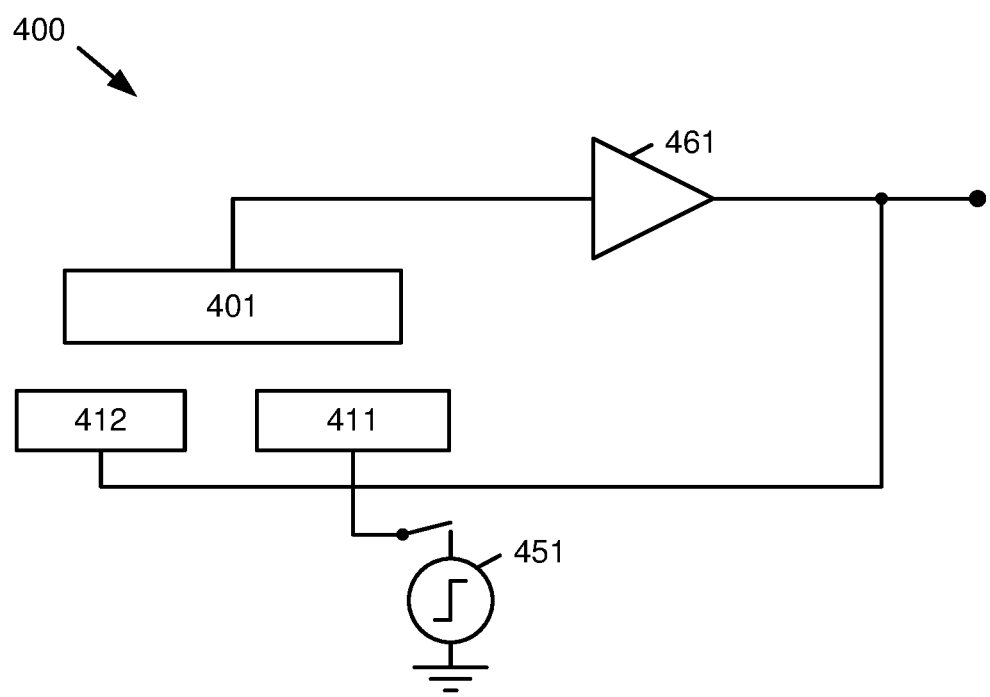
FIG. 4 is a cross-sectional diagram of an electrical device structure that can utilize sensing techniques as shown in FIG. 3.

FIG. 4 illustrates a system 400 for detecting misalignment between a first conductive layer (e.g., a MEMS layer, etc.) including an electrode 401 and a second conductive layer (e.g., a CMOS layer, etc.) including electrodes 411, 412 using the sensing techniques of circuit 300 with gain correction. A nonconductive material (not shown), such as an air gap or a dielectric material, is positioned between the two layers. In an aspect, electrode 401 of the first layer can be a first electrode 40 as shown in FIG. 1. Further, electrodes 411, 412 of the second layer can be respective second electrodes 50 as illustrated in FIG. 1.

As shown by FIG. 4, electrode 411 can be connected to a voltage source 451, and a resulting electrical charge at electrode 401 can be measured by a single-ended sensing circuit 461. The resulting electrical charge can, in turn, be used to calculate misalignment between layers of the system 400, e.g., the first layer including electrode 401 and the second layer including electrodes 411, 412. While FIG. 4 illustrates that electrode 411 and voltage source 451 are connected via a switch, it should be appreciated that other switching configurations could also be used.

In another aspect, each of the impedances of system 400 utilizes the intermediate layer 20 of FIG. 1 (not shown in FIG. 4), so that variation of the thickness of the intermediate layer affects the impedances equally. Thus, the non-sensitive feedback impedance $Z_2$ scales the gain of the sensing circuit (i.e., the ratio between the output voltage of sensing circuit 461 and voltage source 451) to be proportional to the sensed impedances $Z_1$ and $Z_2$. This makes the voltage output of the sensing circuit independent of the thickness of the intermediate layer.

Figure 5:
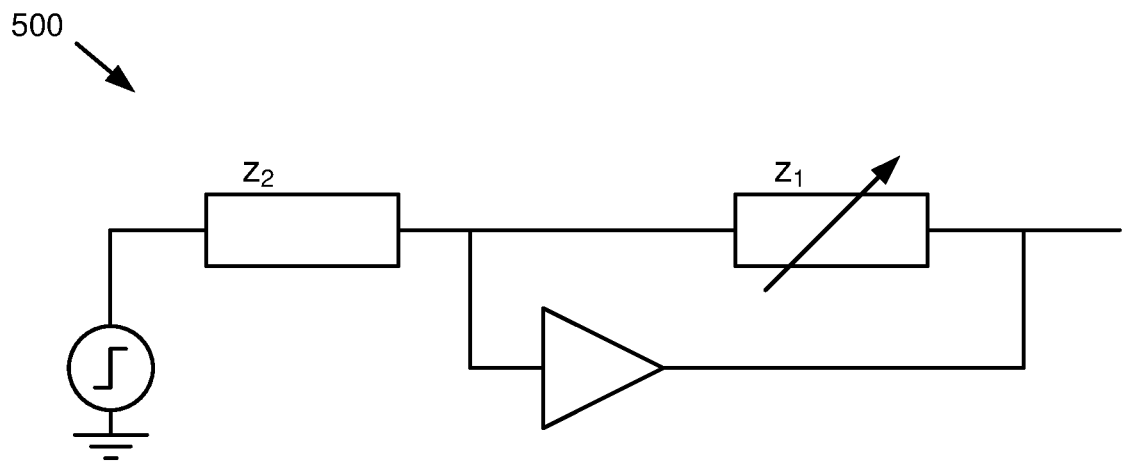
FIG. 5 is a simplified schematic diagram of a single-ended sensing circuit with single-ended feedback sensing and gain correction that can be utilized by various embodiments described herein.

Turning next to FIG. 5, a simplified schematic diagram of a single-ended sensing circuit 500 with single-ended feedback sensing is provided. Here, an impedance $Z_1$ is obtained by applying an input voltage, and the impedance $Z_1$ is used to calculate the extent of misalignment, if any, between the layers of the associated device, e.g., layers 10 and 30 as shown in FIG. 1. In an aspect, the circuit 500 can operate in a similar manner to the circuit 300 shown in FIG. 3 with the exception that the impedance $Z_1$ is connected in feedback around the sensing circuit.

Figure 6:
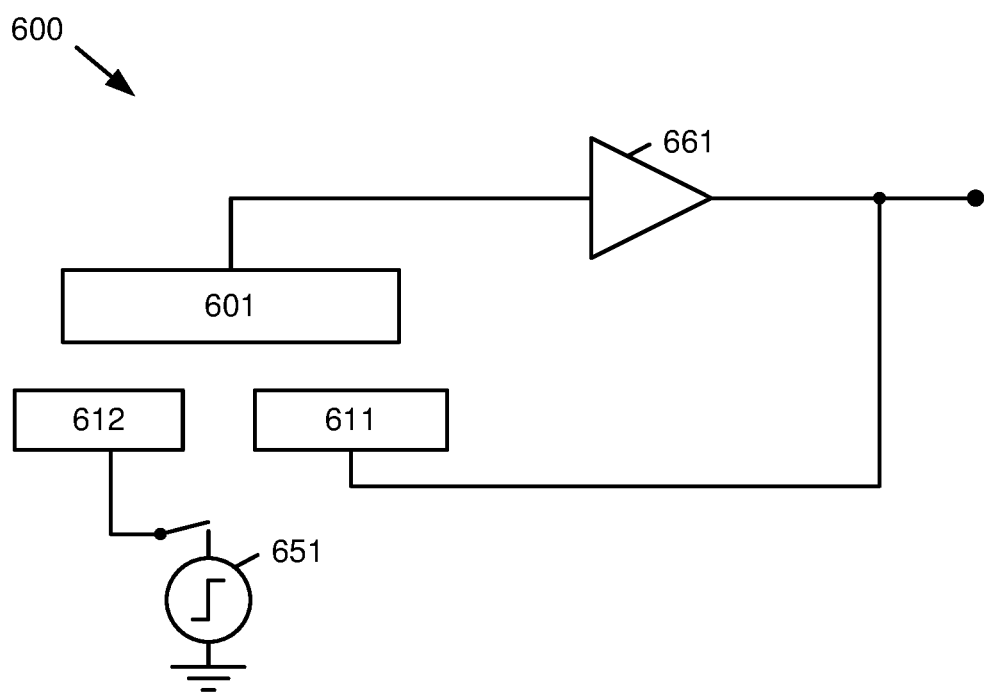
FIG. 6 is a cross-sectional diagram of an electrical device structure that can utilize sensing techniques as shown in FIG. 5.

FIG. 6 illustrates a system 600 for detecting misalignment between a first conductive layer including an electrode 601 and a second conductive layer including electrodes 611, 612 using the sensing techniques of circuit 500. Similar to system 400, a nonconductive material (not shown), such as an air gap or a dielectric material, is positioned between the two layers.

As shown by FIG. 6, electrode 612 can be connected to a voltage source 651, and a resulting electrical charge at electrode 601 can be measured by a single-ended sensing circuit 661. The resulting electrical charge can, in turn, be used to calculate misalignment between layers of the system 400, e.g., the first layer including electrode 601 and the second layer including electrodes 611, 612. While FIG. 6 illustrates that electrode 612 and voltage source 651 are connected via a switch, it should be appreciated that other switching configurations could also be used. In another aspect, the system 600 exhibits gain correction in a similar manner to that described above with respect to system 400.

Figure 7:
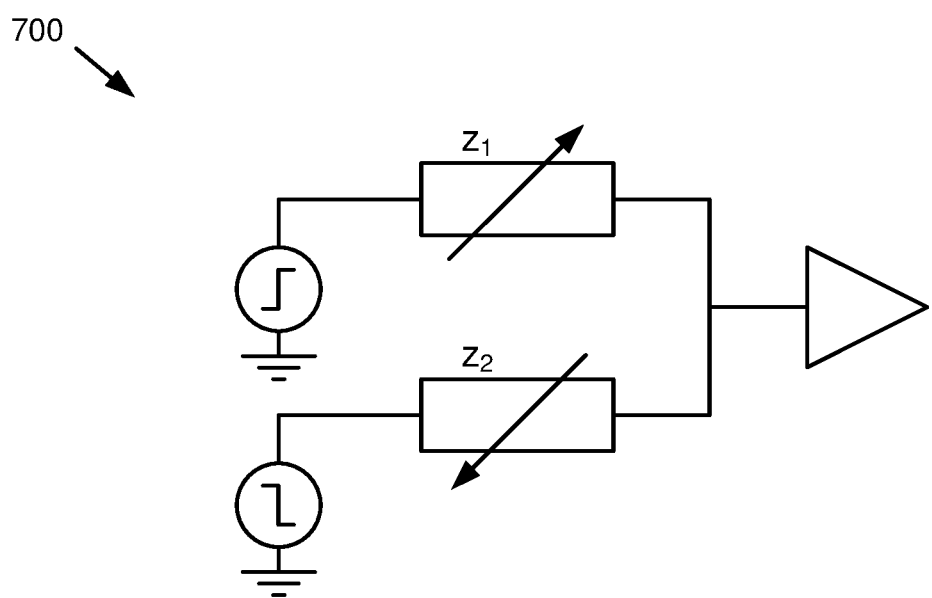
FIG. 7 is a simplified schematic diagram of a differential sensing circuit with single-ended input sensing that can be utilized by various embodiments described herein.

As further illustrated in the drawings, FIG. 7 is a simplified schematic diagram of a differential sensing circuit 700 with single-ended input sensing. Here, the difference of impedances $Z_1$ and $Z_2$ is used to calculate the extent of misalignment, if any, between the layers of the associated device, e.g., layers 10 and 30 as shown in FIG. 1.

Figure 8:
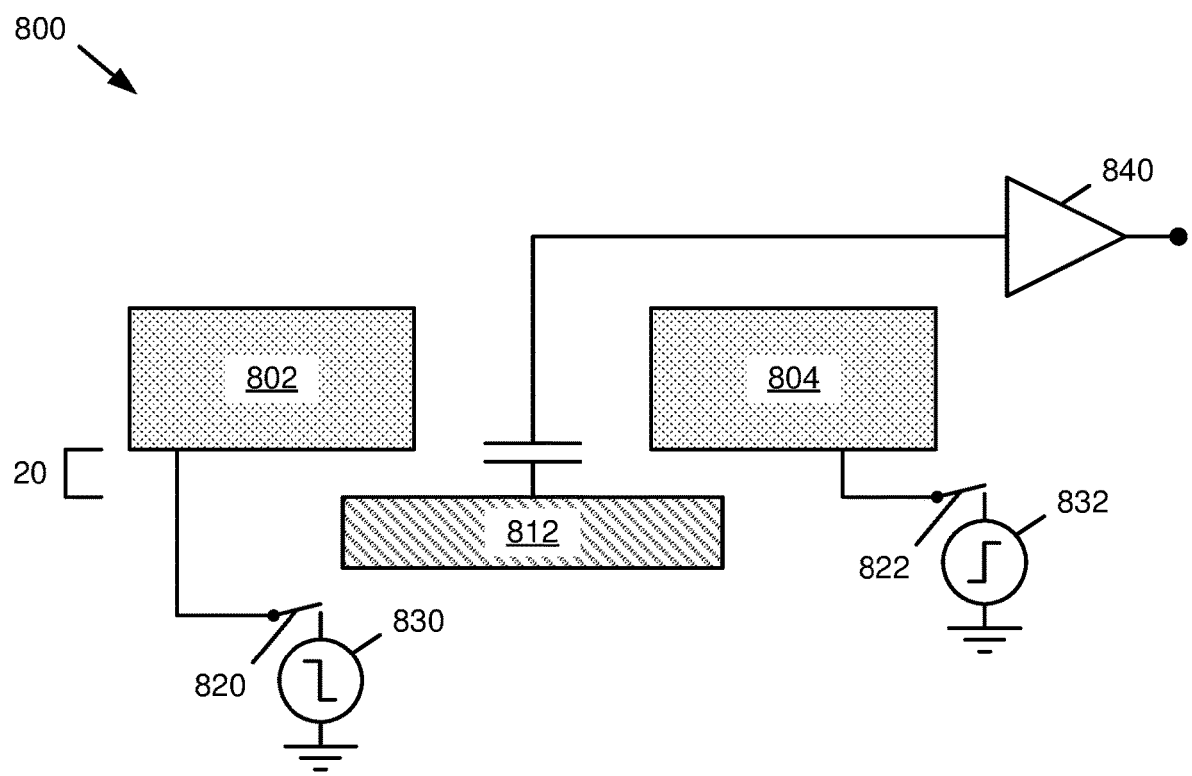
FIG. 8 is a cross-sectional diagram of an electrical device structure that can utilize sensing techniques as shown in FIG. 7.

Turning to FIG. 8, a system 800 for detecting misalignment between conductive layers of an electrical device using the sensing techniques of circuit 700 is illustrated. Here, the semiconductor device includes a first conductive layer (e.g., a MEMS layer, etc.) including two electrodes 802, 804 and a second conductive layer (e.g., a CMOS layer, etc.) including a single electrode 812. An intermediate layer 20 composed of a nonconductive material (not shown), such as an air gap or a dielectric material, is positioned between the two layers.

As shown by system 800, electrodes 802, 804 can be connected via switches 820, 822 to respectively corresponding time-varying voltage sources 830, 832. In an aspect, the voltage provided by voltage sources 830, 832 can differ according to one or more properties, such as amplitude, phase, or the like. In the example shown by FIG. 8, voltage sources 830, 832 produce respective square waves having opposite phases, e.g., differing by 180 degrees. Other configurations could also be used.

In a similar manner to the embodiments described above, the voltage sources 830, 832 cause an amount of electrical charge to be stored between the electrodes 802, 804 of the first layer and electrode 812 of the second layer that is proportional to misalignment between the first layer and the second layer in an in-plane direction. Electrode 812 is further electrically connected to a single-ended sensing circuit 840, which measures the differential capacitance of the half-bridge structure corresponding to electrodes 802, 804, 812 and/or the associated electrical charge to determine an extent of misalignment between the layers of the semiconductor device. In one example, alternative switching configurations to that shown in FIG. 8 could be used. For instance, electrode 812 could be connected to sensing circuit 840 via a switch in addition to, or in place of, switches 820, 822.

Figure 9:
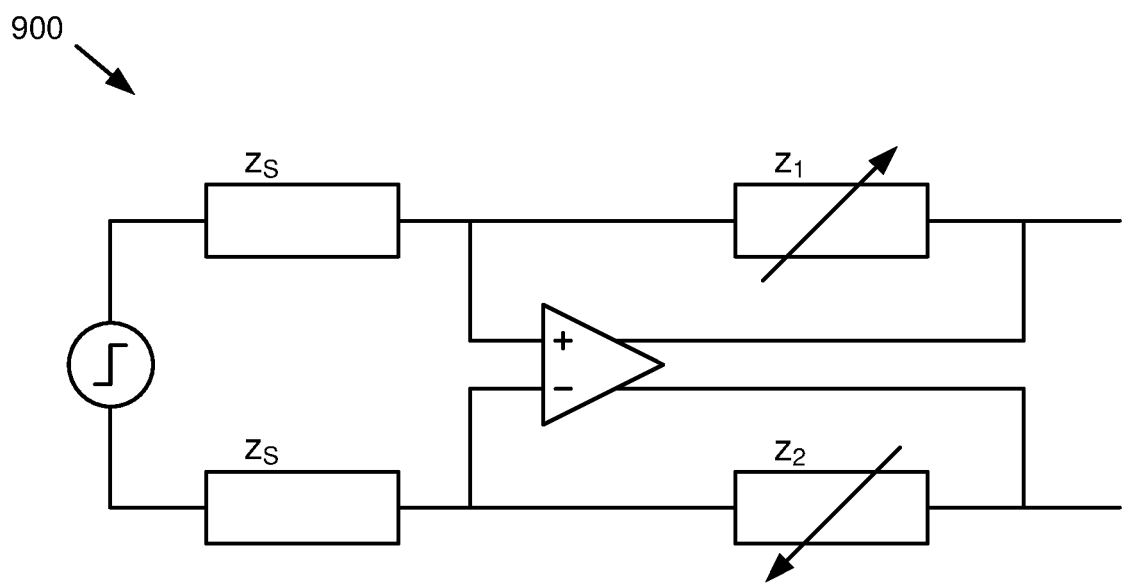
FIG. 9 is a simplified schematic diagram of a differential sensing circuit with differential feedback sensing that can be utilized by various embodiments described herein.

Turning next to FIG. 9, a simplified schematic diagram of a differential sensing circuit 900 with differential feedback sensing is provided. As shown by FIG. 9, a source impedance $Z_s$ is present in the circuit 900, which need not be part of the MEMS structure and need not be used by the sensing circuit for misalignment measurement.

Figure 10:
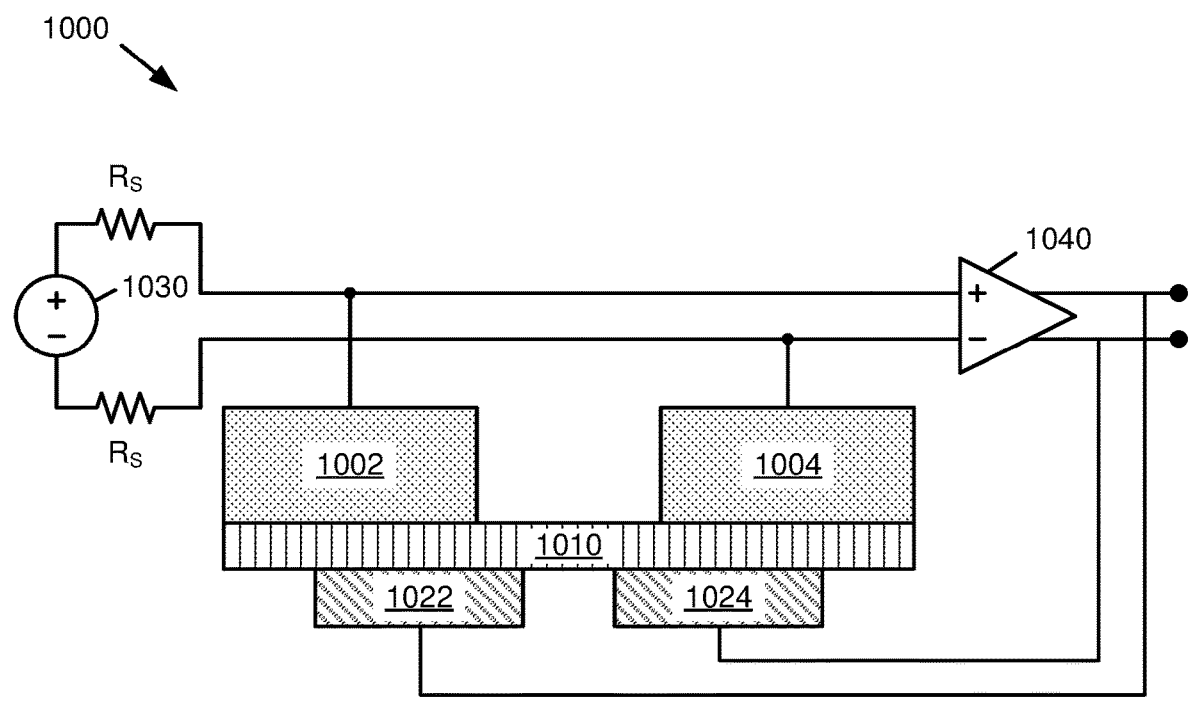
FIGS. 10-11 are cross-sectional diagrams of respective electrical device structures that can utilize sensing techniques as shown in FIG. 9.

Turning to FIG. 10, illustrated is a system 1000 for detecting misalignment between a first conductive layer (e.g., a MEMS layer, etc.) including electrodes 1002, 1004 and a second conductive layer (e.g., a CMOS layer, etc.) including electrodes 1022, 1024 using the sensing techniques of circuit 1000 in a resistive configuration. In an aspect, a conductive intermediate layer 1010 is positioned between the two conductive layers associated with electrodes 1002, 1004, 1022, 1024. As further shown by FIG. 10, the source impedance $Z_s$ in circuit 900 is represented by resistors $R_s$. In an embodiment, the conductance of the intermediate layer 1010 may be substantially greater than the conductances of electrodes 1002, 1004, 1022, 1024. In another embodiment, the conductance of the intermediate layer 1010 may be substantially less than the conductances of electrodes 1002, 1004, 1022, 1024. Other configurations are also possible.

As further shown by system 1000, electrodes 1002, 1004 can be connected via switches to respective poles of a voltage source 1030. While the voltage source 1030 shown in FIG. 10 is a DC voltage source, a time-varying voltage source or other suitable voltage source could be used. When engaged, the voltage source 1030 causes an amount of differential electrical current in the intermediate layer 1010 between the respective electrodes 1002, 1004 of the first layer and electrodes 1022, 1024 of the second layer. In an aspect, the amount of resulting differential electrical conductance is proportional or otherwise related to misalignment between the first layer and the second layer in an in-plane direction. In an aspect, electrodes 1002, 1004 are further electrically connected to a differential sensing circuit 1040, which measures the differential electrical current of the half-bridge structure to determine an extent of misalignment between the layers of the semiconductor device. As further shown by system 1000, the differential electrical conductance proportional to misalignment is connected in the feedback position of the sensing circuit 1040.

Figure 11:
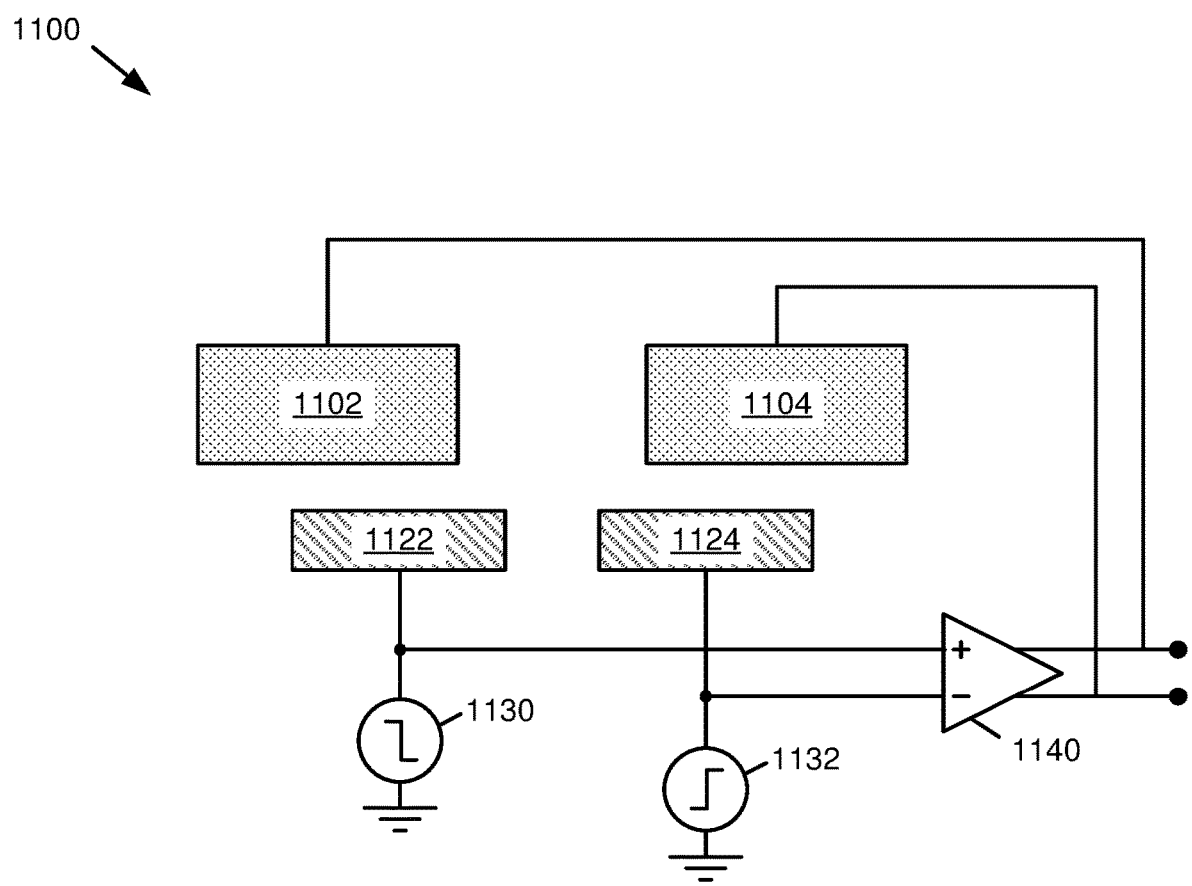

System 1100 in FIG. 11 illustrates an alternative configuration to system 1000 in an embodiment having two electrodes 1102, 1104 in the first conductive layer and two electrodes 1022, 1024 in the second conductive layer. In contrast to system 1000, system 1100 utilizes capacitive sensing to determine an extent of misalignment, if any, between the first and second conductive layers. As such, a nonconductive layer, such as an air gap or the like, is positioned between the two conductive layers, and time-varying input voltages 1130, 1132 are respectively applied to electrodes 1122, 1124. A differential sensing circuit is electrically connected to electrodes 1102, 1104 of the second conductive layer, which function to determine the extent of misalignment between the first and second conductive layers in an in-plane direction based on a sensed differential capacitance.

Figure 12:
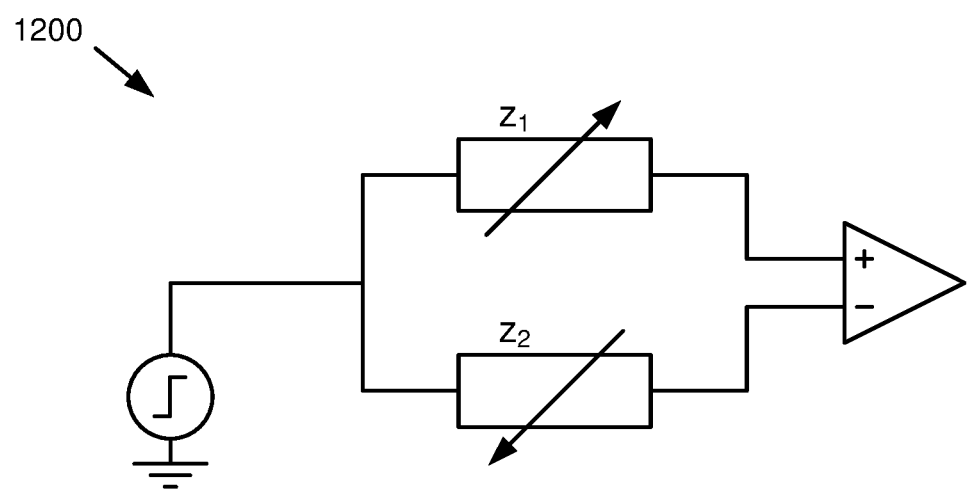
FIG. 12 is a simplified schematic diagram of a half-bridge sensing circuit with differential input sensing that can be utilized by various embodiments described herein.

Turning next to FIG. 12, a simplified schematic diagram of a half-bridge sensing circuit 1200 with differential input sensing is illustrated. The difference of the respective impedances $Z_1$ and $Z_2$, can be observed at the sensing circuit and used to calculate the misalignment between layers of the structure.

Figure 13:
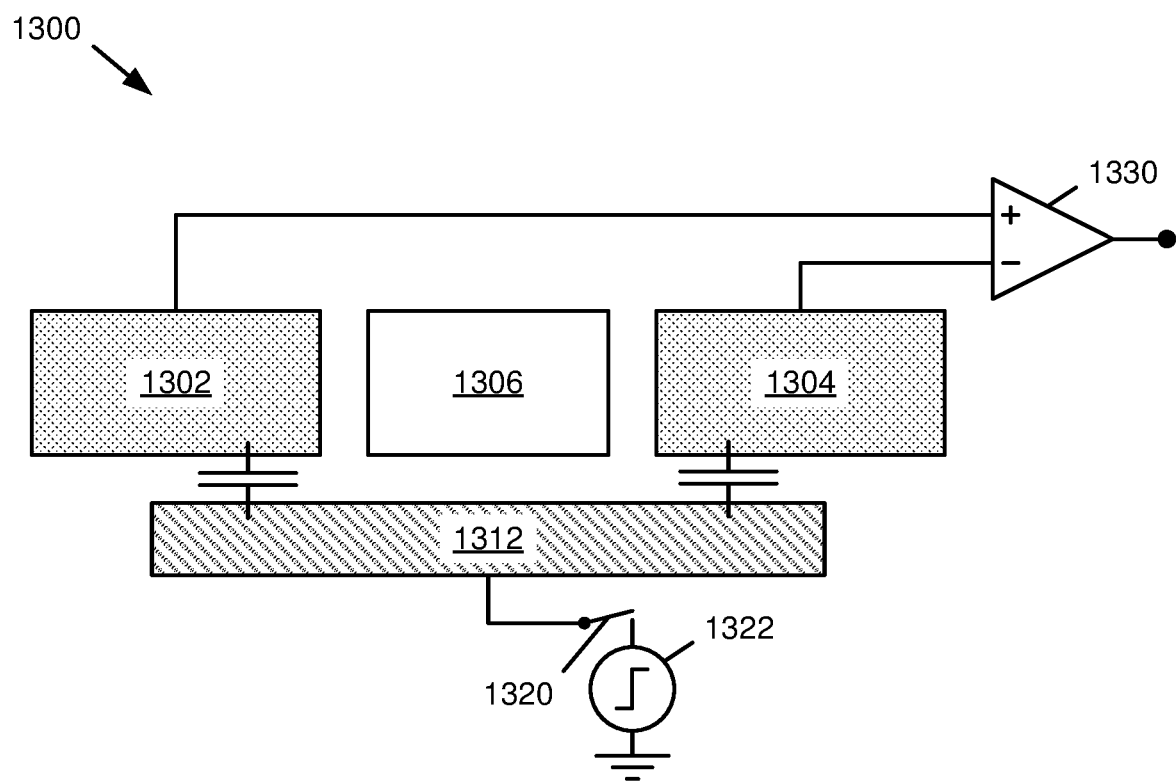
FIGS. 13-15 are cross-sectional diagrams of respective electrical device structures that can utilize sensing techniques as shown in FIG. 12.

FIG. 13 illustrates a system 1300 for detecting misalignment between a first conductive layer (e.g., a MEMS layer, etc.) including electrodes 1302, 1304, 1306, and a second conductive layer (e.g., a CMOS layer, etc.) including an electrode 1312, according to the sensing techniques of circuit 1200. A nonconductive material (not shown), such as an air gap or a dielectric material, is positioned between the two layers. Here, electrodes 1302 and 1304 of the first layer are associated with sensing nodes, and electrode 1306 of the first layer can in some embodiments be utilized as a secondary sensing node as described below. Alternatively, the first conductive layer may include only electrodes 1302 and 1304.

As further shown by system 1300, electrode 1312 can be connected via a switch 1320 to a time-varying voltage source 1322 (e.g., a square wave voltage generator, etc.). When engaged, the voltage source 1322 causes an amount of electrical charge to be stored between electrodes 1302, 1304 of the first layer and electrode 1312 of the second layer. In an aspect, the difference of the respective amounts of charge is proportional to misalignment between the first layer and the second layer in an in-plane direction. This stored electrical charge difference corresponds to a capacitance difference between electrodes 1302, 1304 of the first layer and electrode 1312 of the second layer, which is shown in FIG. 13 as equivalent capacitors for clarity of illustration. In this way, electrodes 1302, 1304, 1312 operatively form a capacitive half-bridge structure having a differential capacitance proportional to the misalignment of the layers of the underlying semiconductor device. As additionally shown by system 1300, electrodes 1302, 1304 are electrically connected to a differential sensing circuit 1330, which measures the differential capacitance of the half-bridge structure and/or the associated electrical charge to determine an extent of misalignment between the layers of the semiconductor device.

In an aspect, electrode 1306 can be utilized to calculate a specific capacitance (i.e., capacitance per unit area) associated with the first and second conductive layers, from which the approximate thickness of the intermediate layer between the first and second conductive layers can be derived. By way of example, electrode 1306 can be connected to a single-ended sensing circuit (not shown) that is different from sensing circuit 1330. The output of the single-ended sensing circuit resulting from the procedure described above can be proportional or inversely proportional to the thickness of the intermediate layer, which can be used in combination with the measured electrical charge to determine the capacitance between the first and second layers.

While FIG. 13 illustrates that electrode 1312 and voltage source 1322 are connected via a switch 1320, it should be appreciated that other switching configurations could also be used. For instance, the respective connections between sensing electrodes 1302, 1304 and the sensing circuit 1330 could be controlled by similar switching mechanisms in addition to, or in place of, switch 1320 connecting electrode 1312 to voltage source 1322.

Figure 14:
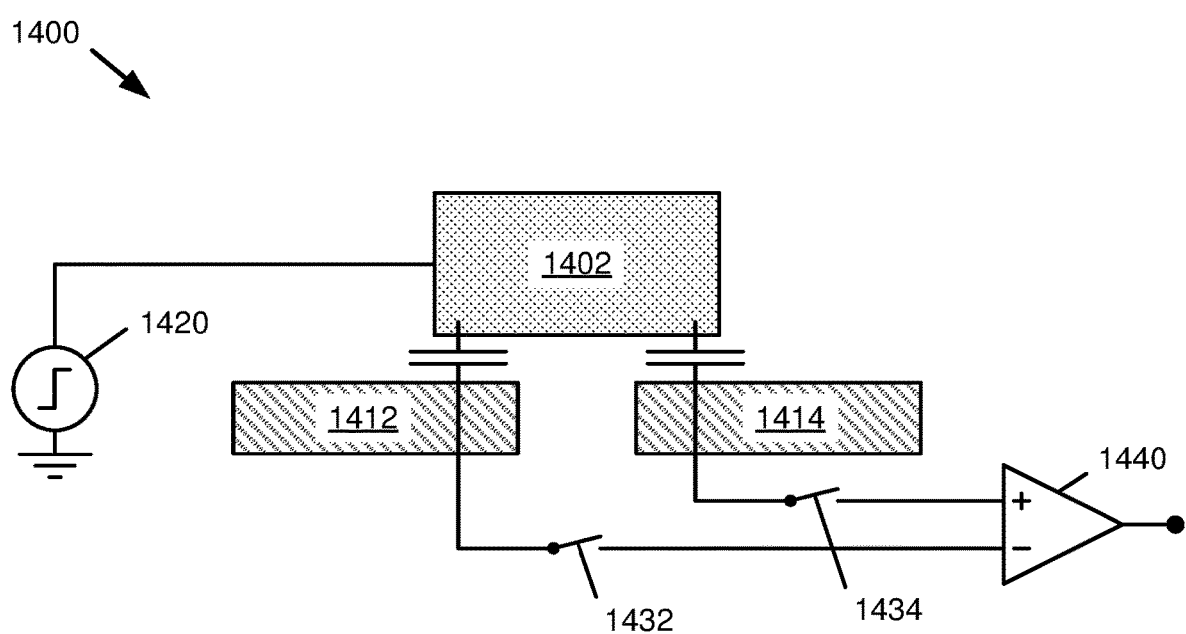

With reference next to FIG. 14, illustrated is another system 1400 for detecting misalignment between conductive layers of a semiconductor device, here a first conductive layer (e.g., a MEMS layer, etc.) including an electrode 1402 and a second conductive layer (e.g., a CMOS layer, etc.) including two electrodes 1412, 1414, using the sensing techniques of circuit 1200. Similar to system 1300, a non-conductive material (not shown), such as an air gap or a dielectric material, is positioned between the two layers.

As further shown by system 1400, electrode 1402 can be connected to a time-varying voltage source 1420 (e.g., a square wave voltage generator, etc.), which causes an amount of electrical charge to be stored between electrode 1402 of the first layer and electrodes 1410, 1412 of the second layer. Similarly to system 1300 described above, the difference of the respective amounts of charge can be proportional to misalignment between the first layer and the second layer in an in-plane direction, enabling electrodes 1402, 1412, 1414 to operate as a capacitive half-bridge structure in a similar manner to system 1300. As additionally shown by system 1400, electrodes 1412, 1414 of the second layer can be electrically connected via respective switches 1432, 1434 to a differential sensing circuit 1440, which measures the capacitance of the half-bridge structure and/or the associated electrical charge to determine an extent of misalignment between the layers of the semiconductor device.

While FIG. 14 illustrates that electrodes 1412, 1414 are connected to sensing circuit 1440 via respective switches 1432, 1434, it should be appreciated that other switching configurations could also be used. For instance, electrode 1402 could be connected to voltage source 1420 via a switch in addition to, or in place of, switches 1432, 1434.

Figure 15:
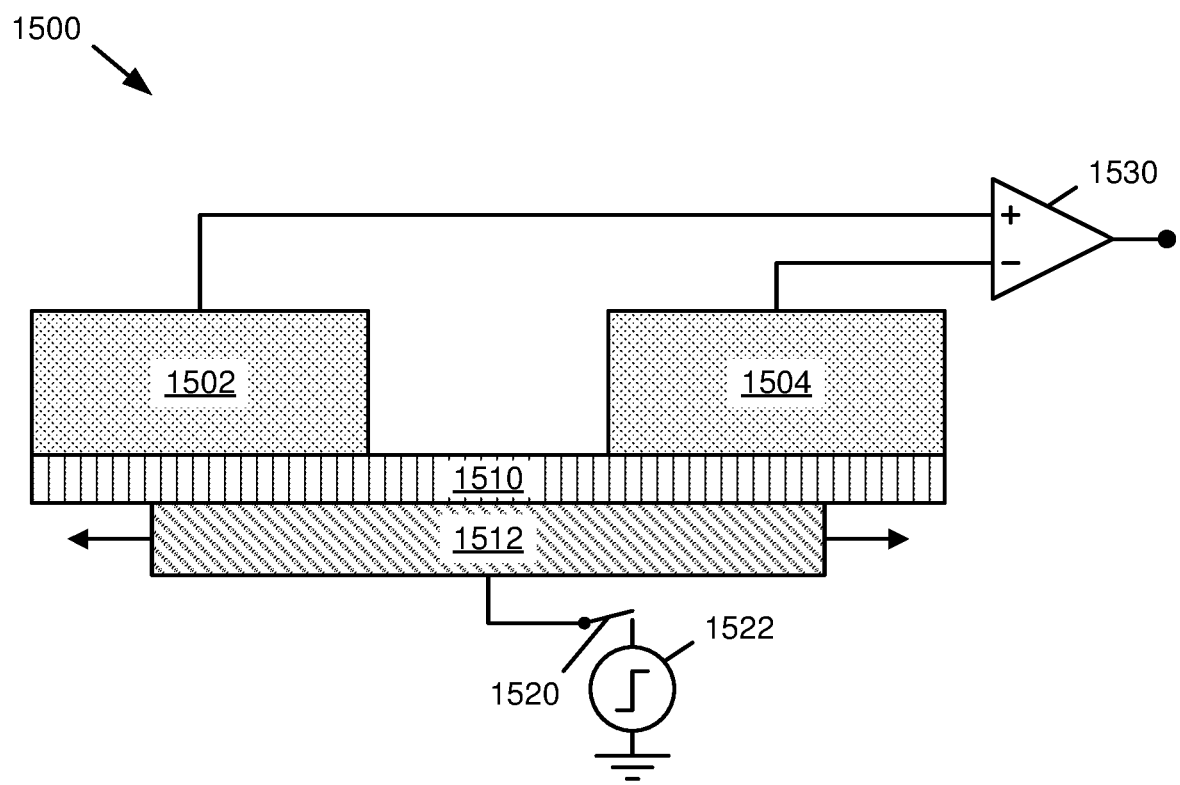

With reference next to FIG. 15, illustrated is a system 1500 for detecting misalignment between a first conductive layer (e.g., a MEMS layer, etc.) including electrodes 1502, 1504, 1506, and a second conductive layer (e.g., a CMOS layer, etc.) including an electrode 1512 using a resistive half-bridge structure according to the sensing techniques of circuit 1200. A conductive intermediate layer 1510 is positioned between the two conductive layers associated with electrodes 1502, 1504, 1506, 1512.

As further shown by system 1500, electrode 1512 can be connected via a switch 1520 to a voltage source 1522. While the voltage source 1522 shown in FIG. 15 is a DC voltage source, other voltage sources could be used, such as the time-varying voltage source 1522 described above with respect to FIGS. 13-14. When engaged, the voltage source 1522 causes an amount of differential electrical current in the intermediate layer 1510 between electrodes 1502, 1504 of the first layer and electrode 1512 of the second layer. In an aspect, the resulting amount of differential electrical conductance is proportional to misalignment between the first layer and the second layer in an in-plane direction. In an aspect, electrodes 1502, 1504 are electrically connected to a differential sensing circuit 1530, which measures the differential conductance of the half-bridge structure to determine an extent of misalignment between the layers of the semiconductor device.

Figure 16:
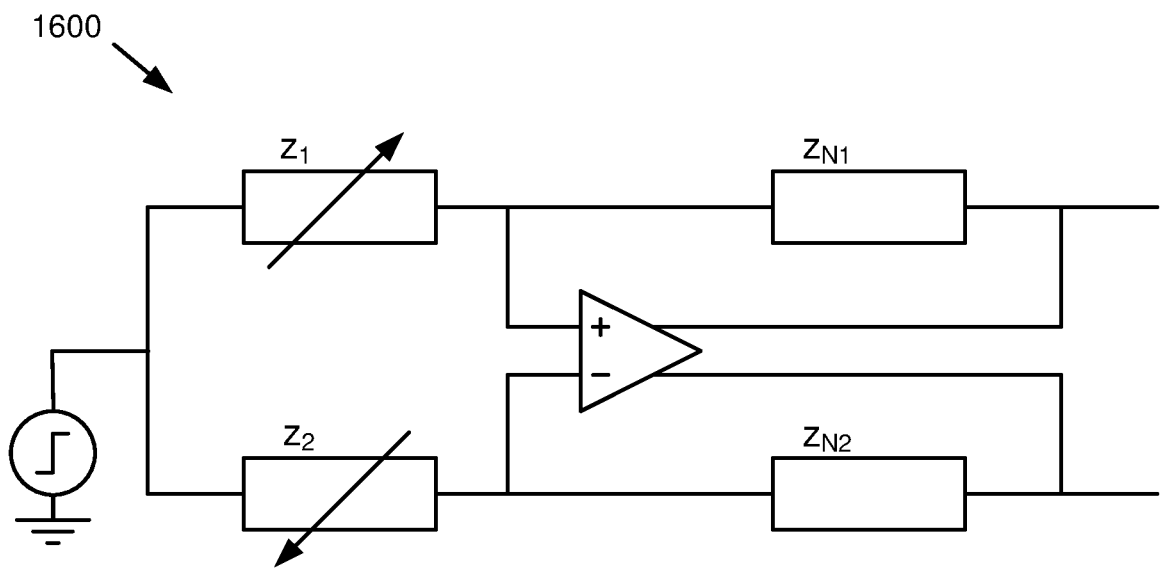
FIG. 16 is a simplified schematic diagram of a half-bridge sensing circuit with differential input sensing and gain correction that can be utilized by various embodiments described herein.

Referring next to FIG. 16, a half-bridge sensing circuit 1600 with differential input sensing and gain correction is illustrated. In an aspect, each of the impedances of circuit 1600 utilize the intermediate layer, so that variation of the thickness of the intermediate layer affects the impedances equally. Thus, the non-sensitive feedback impedances $Z_{N1}$ and $Z_{N2}$ scale the gain of the sensing circuit to be proportional to the sensed impedances $Z_1$ and $Z_2$. This makes the voltage output of the sensing circuit independent of the thickness of the intermediate layer.

Figure 17:
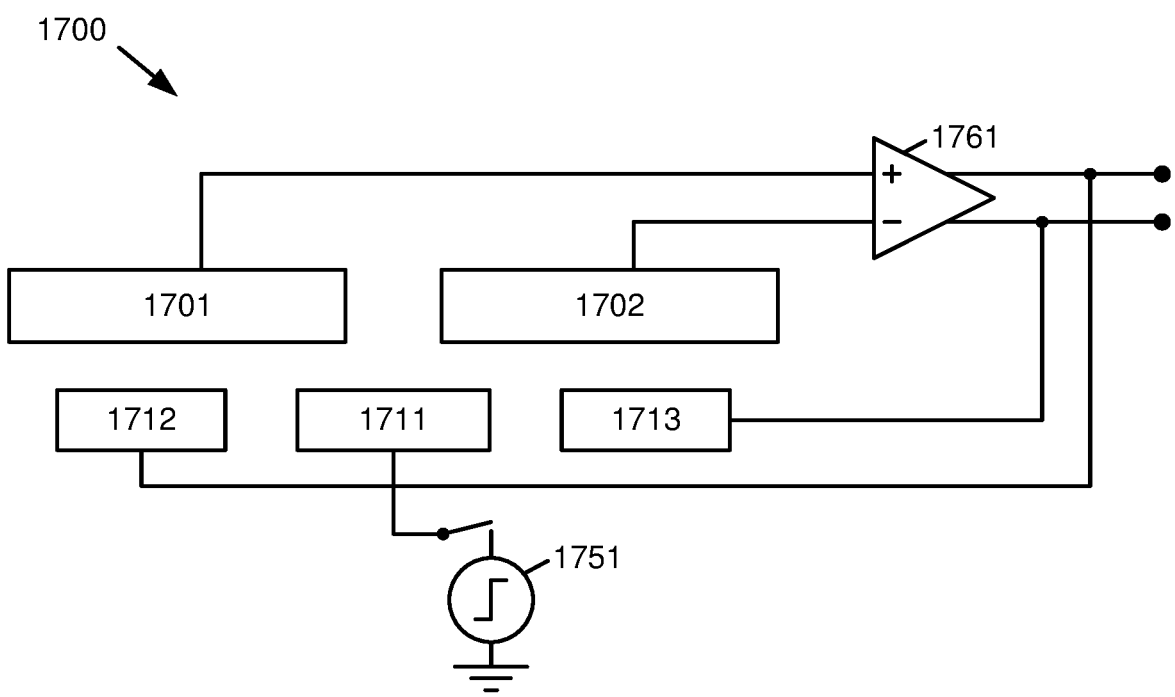
FIG. 17 is a cross-sectional diagram of an electrical device structure that can utilize sensing techniques as shown in FIG. 16.

FIG. 17 illustrates a system 1700 for detecting misalignment between a first conductive layer including electrodes 1701, 1702, and a second conductive layer including electrodes 1711, 1712, 1713 according to the sensing techniques of circuit 1600. As shown by FIG. 17, electrode 1711 can be connected to a voltage source 1751, and a resulting electrical charge at electrodes 1701, 1702 can be measured by a differential sensing circuit 1761.

Figure 18:
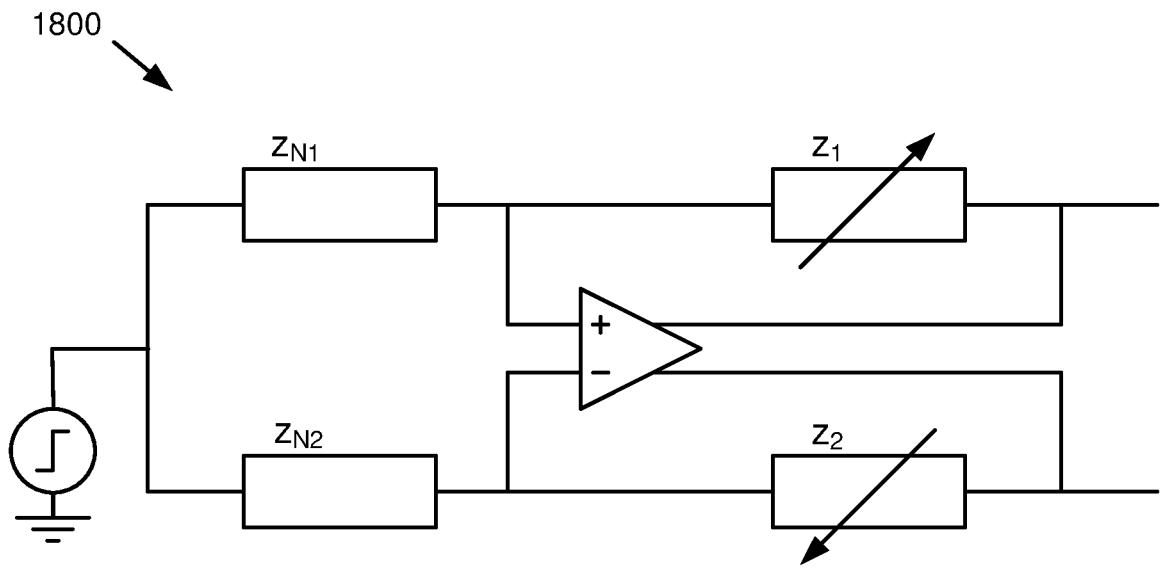
FIG. 18 is a simplified schematic diagram of a half-bridge sensing circuit with differential feedback sensing and gain correction that can be utilized by various embodiments described herein.

Turning to FIG. 18, a half-bridge sensing circuit 1800 with differential feedback sensing and gain correction is illustrated. In an aspect, circuit 1800 can employ a similar half-bridge differential sensing circuit with gain correction to that shown by circuit 1600, which differs from circuit 1600 in that the positions of impedances $Z_1$ and $Z_2$ and those of $Z_{N1}$ and $Z_{N2}$ are interchanged.

Figure 19:
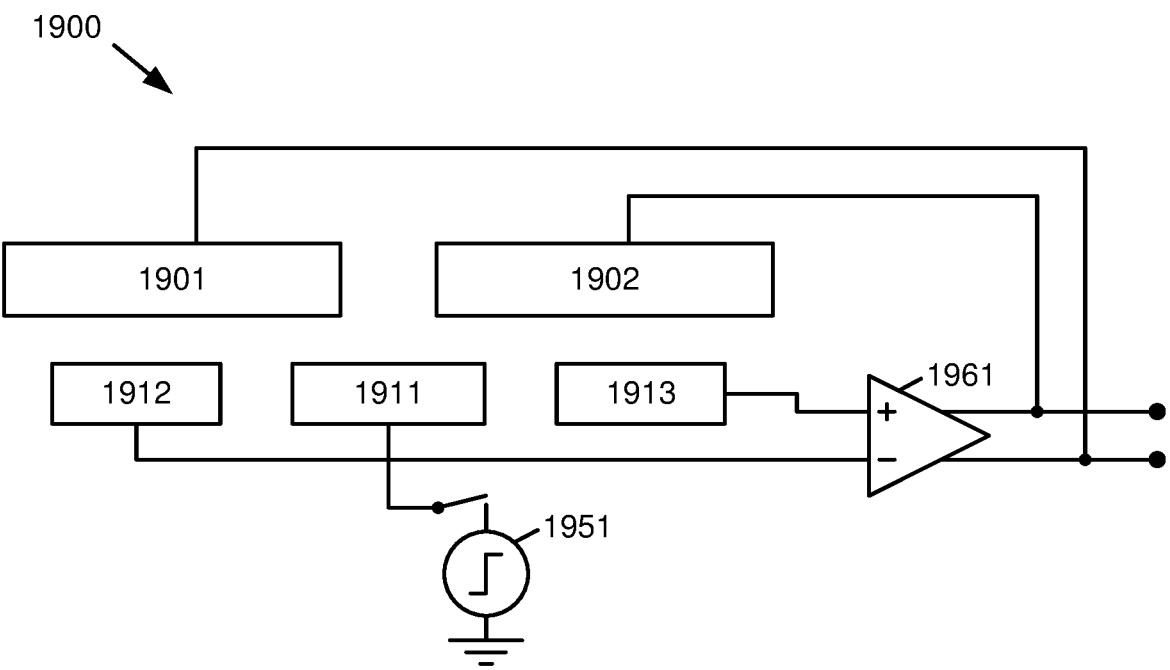
FIG. 19 is a cross-sectional diagram of an electrical device structure that can utilize sensing techniques as shown in FIG. 18.

FIG. 19 illustrates a system 1900 for detecting misalignment between a first conductive layer including electrodes 1901, 1902, and a second conductive layer including electrodes 1911, 1912, 1913 according to the sensing techniques of circuit 1800. As shown by FIG. 19, electrode 1911 can be connected to a voltage source 1951, and a resulting electrical charge at electrodes 1911, 1912 can be measured by a differential sensing circuit 1961.

Figure 20:
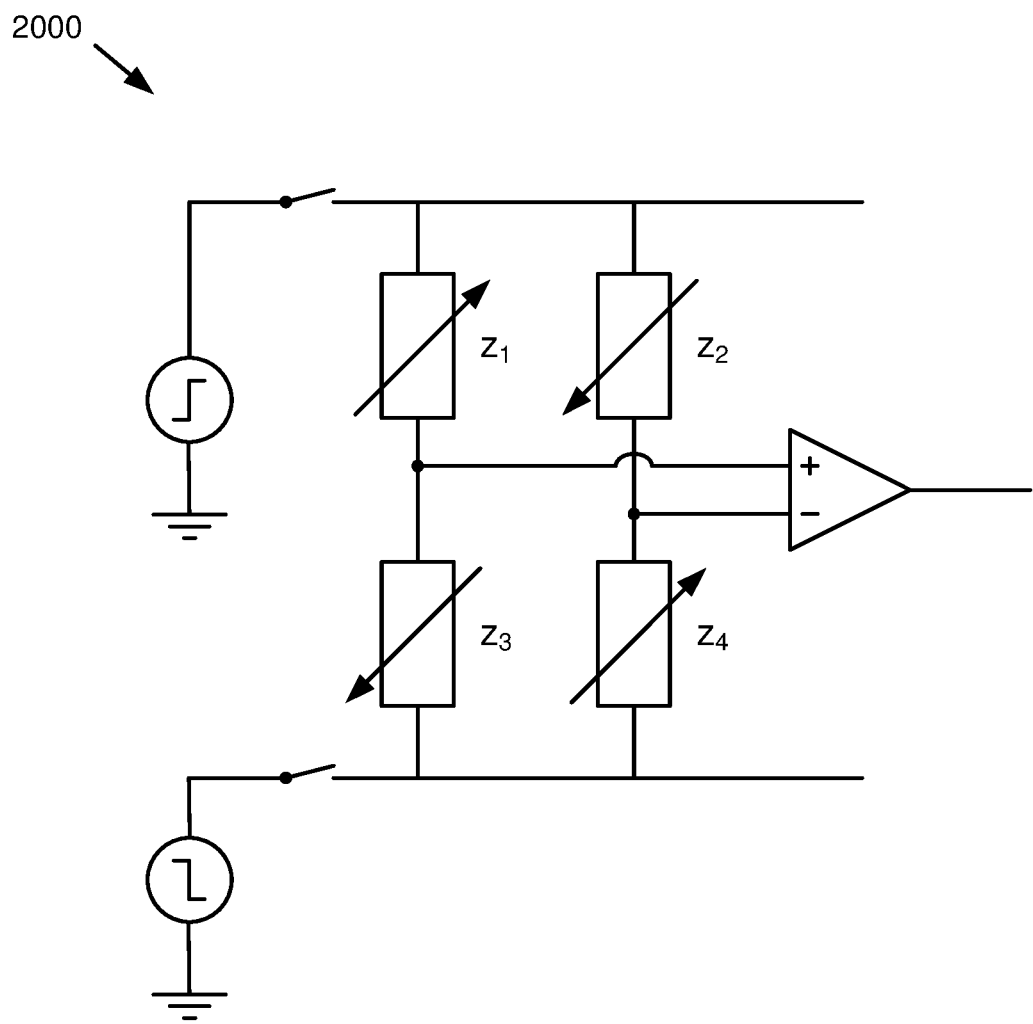
FIG. 20 is a simplified schematic diagram of a full-bridge sensing circuit with differential input sensing that can be utilized by various embodiments described herein.

Referring next to FIG. 20, a simplified schematic diagram of a full-bridge sensing circuit 2000 with differential input sensing is provided. In an aspect, the full-bridge structure can be constructed from two half-bridge structures according to one or more embodiments described above. The half-bridge structures, in turn, can correspond to respective portions of a semiconductor device and/or its respective conductive layers. For instance, a first half-bridge structure could correspond to a first sensor or other device or circuit implemented on a semiconductor chip while the second half-bridge could correspond to a second, different device or circuit. Other configurations are also possible. As further illustrated in FIG. 20, the first half-bridge corresponds to impedances $Z_1$ and $Z_2$, and the second half-bridge corresponds to impedances $Z_3$ and $Z_4$.

Figure 21:
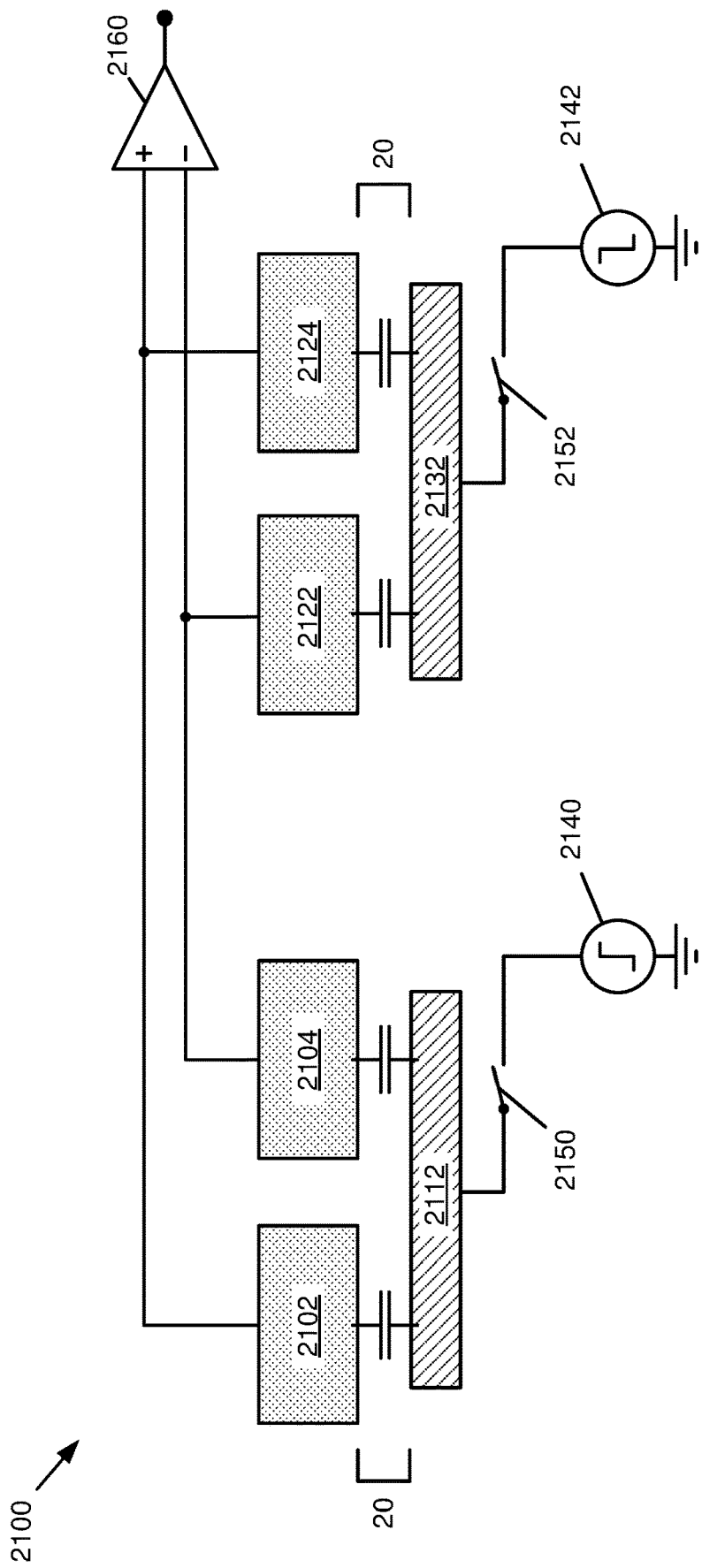
FIGS. 21-22 are cross-sectional diagrams of respective electrical device structures that can utilize sensing techniques as shown in FIG. 20.

Referring next to FIG. 21, a system 2100 for measuring misalignment of a semiconductor device according to the sensing techniques of circuit 2000 includes two conductive layers that are physically or electrically separated into two distinct portions. Electrodes 2102 and 2104 are associated with a first portion of the first conductive layer, and electrode 2112 is associated with a first portion of the second conductive layer. Similarly, electrodes 2122 and 2124 are associated with a second portion of the first conductive layer, and electrode 2132 is associated with a second portion of the second conductive layer. As further shown in FIG. 21, a nonconductive intermediate layer 20 is positioned between the first and second conductive layers, which can be composed of an air gap or a dielectric material in a similar manner to that described above with respect to FIG. 8.

In an aspect, electrodes 2102, 2104 are connected to a first time-varying voltage source 2140 via a first switch 2150. Similarly, electrodes 2122, 2124 are connected to a second time-varying voltage source 2142 via a second switch 2152. For instance, as shown in FIG. 21, voltage sources 2140, 2142 are two distinct square-wave generators having opposite phases. Other configurations, wave types, etc., could also be used.

In a similar manner to that described above, the voltage source 2140 causes a differential amount of electrical charge to be stored between electrodes 2102, 2104 of the first layer and electrode 2112 of the second layer. Similarly, the voltage source 2142 causes a differential amount of electrical charge to be stored between electrodes 2122, 2124 of the first layer and electrode 2132 of the second layer. Electrodes 2102, 2124 of the first layer are connected to a first input of a differential sensing circuit 2160, and electrodes 2104, 2122 of the first layer are connected to a second input of differential sensing circuit 2160. Differential sensing circuit 2160, in turn, determines an extent of misalignment between the first and second conductive layers, and/or respective component electrodes, sensing nodes, or other features associated with the conductive layers, as a function of the stored electrical charge and/or its associated capacitance.

Figure 22:
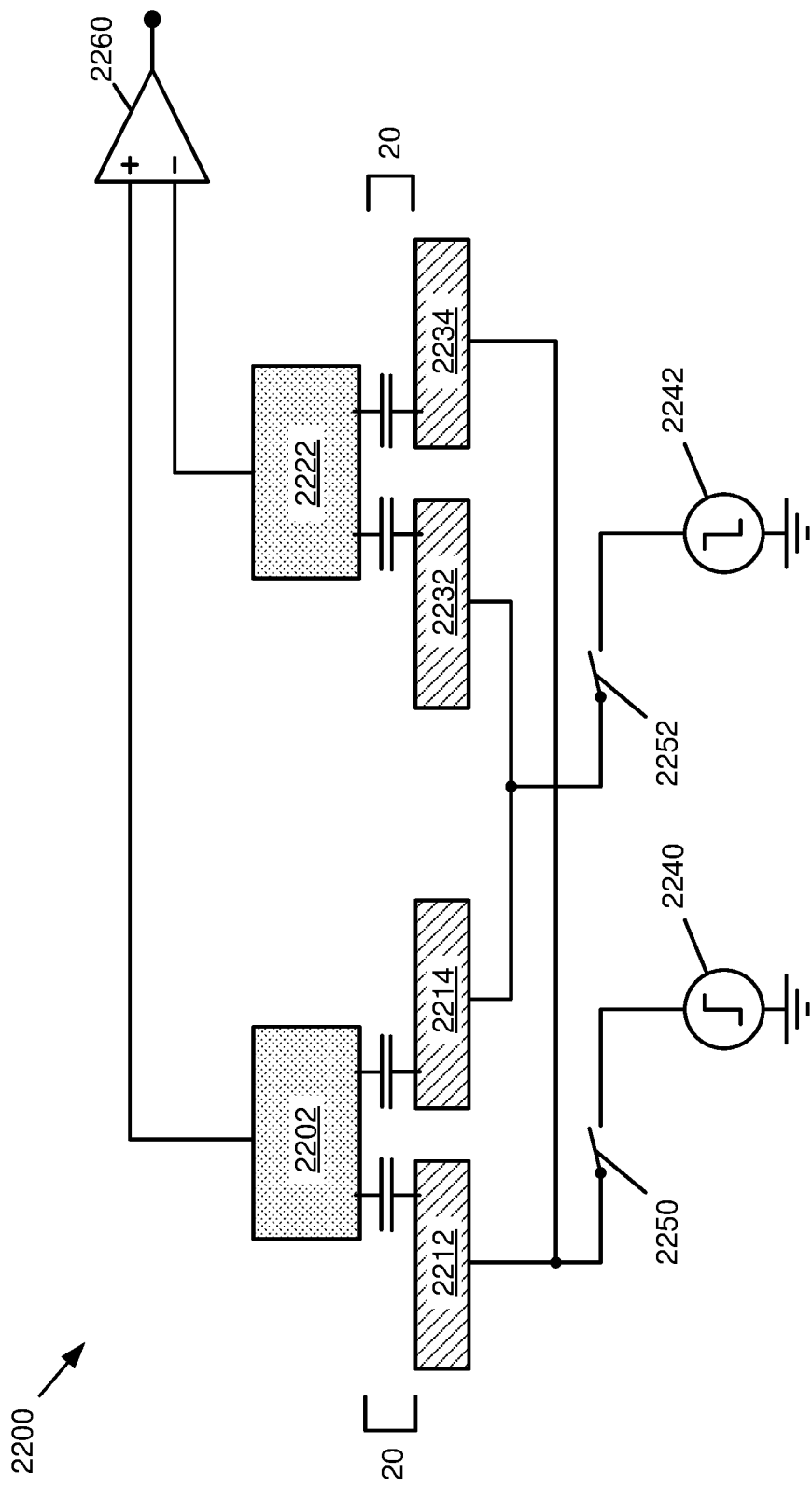

System 2200 in FIG. 22 illustrates an alternative configuration to system 2100 in an embodiment in which the first portion of the semiconductor device includes a single electrode 2202 in the first conductive layer and two electrodes 2212, 2214 in the second conductive layer, and the second portion of the semiconductor device includes a single electrode 2222 in the first conductive layer and two electrodes 2232, 2234 in the second conductive layer. Similar to system 2100 in FIG. 21, a nonconductive intermediate layer 20 is positioned between the first and second conductive layers of system 2200, which can be composed of an air gap or a dielectric material in a similar manner to that described above with respect to FIG. 8. As shown by FIG. 22, electrodes 2212, 2234 of the second layer are connected to a first time-varying voltage 2240 via a first switch 2250, and electrodes 2214, 2232 of the second layer are connected to a second time-varying voltage 2242 via a second switch 2252. The time-varying voltages 2240, 2242 can vary in phase and/or other characteristics in a similar manner to the time-varying voltages 640, 642, and/or in any other suitable manner. As further shown by system 2200, electrodes 2202, 2222 of the first layer are connected to respective inputs of a differential sensing circuit 2260, which determines an extent of misalignment between the first and second conductive layers, and/or respective component electrodes, sensing nodes, or other features associated with the conductive layers, as a function of the stored electrical charge and/or its associated capacitance.

Figure 23:
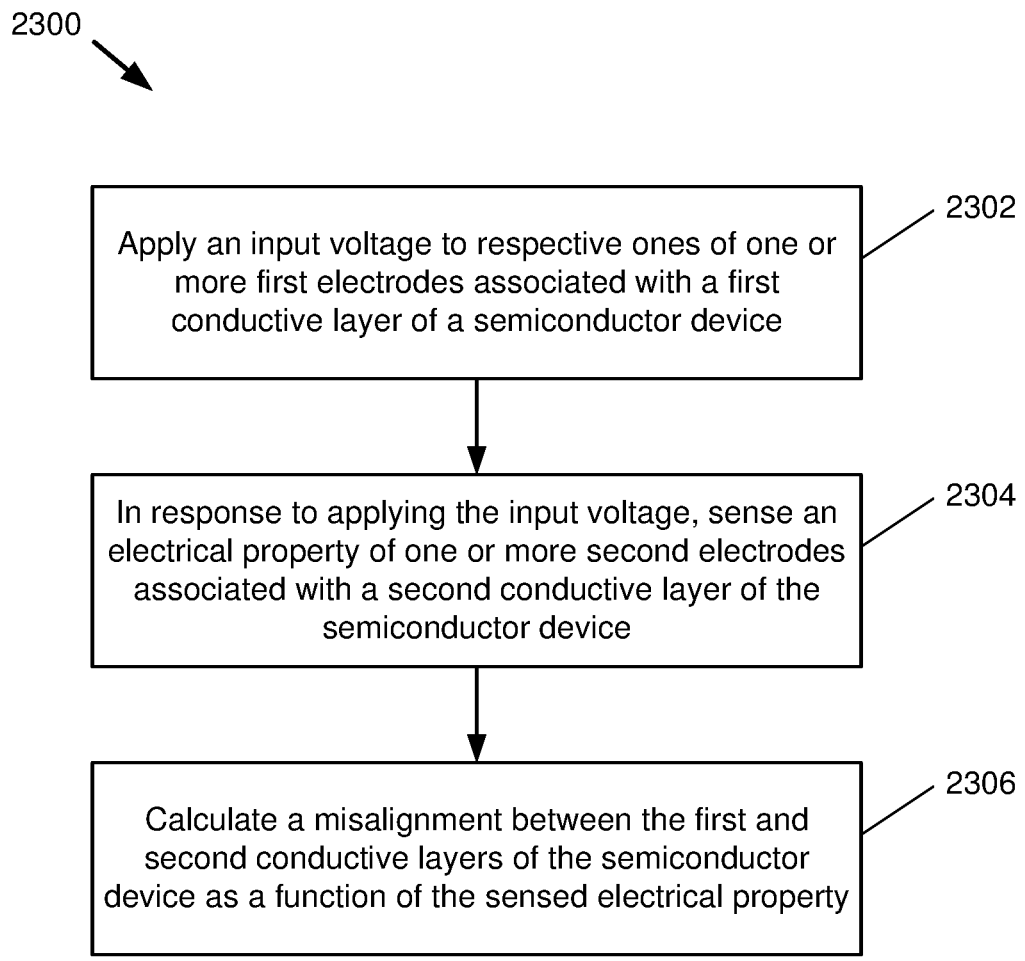
FIG. 23 is a flow diagram of a method for detecting misalignment between layers of a semiconductor device in accordance with one or more embodiments of the disclosure.

FIG. 23 presents a flowchart of an example method 2300 for detecting misalignment between layers of a semiconductor device in accordance with one or more embodiments of the disclosure. At block 2302, an input voltage is applied to respective ones of one or more first electrodes (e.g., first electrodes 40) associated with a first conductive layer (e.g., conductive layer 10) of a semiconductor device.

At 2304, in response to applying the input voltage at 2302, an electrical property of one or more second electrodes (e.g., second electrodes 50) associated with a second conductive layer (e.g., conductive layer 30) of the semiconductor device is sensed (e.g., via a sensing circuit 60). The electrical property sensed at 2304 can include, but is not limited to, electrical charge, electrical conductance, capacitance, etc. In an aspect, the electrical property can be sensed by first measuring an output voltage associated with the one or more second electrodes and subsequently determining the electrical property from the measured output voltage.

At 2306, a misalignment between the first and second conductive layers of the semiconductor device, e.g., in an in-plane direction, is calculated as a function of the electrical property sensed at 2304.

In the present specification, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in this specification and annexed drawings should generally be construed to mean "one or more" unless specified otherwise or clear from context to be directed to a singular form.

In addition, the terms "example" and "such as" are utilized herein to mean serving as an instance or illustration. Any embodiment or design described herein as an "example" or referred to in connection with a "such as" clause is not necessarily to be construed as preferred or advantageous over other embodiments or designs. Rather, use of the terms "example" or "such as" is intended to present concepts in a concrete fashion. The terms "first," "second," "third," and so forth, as used in the claims and description, unless otherwise clear by context, is for clarity only and doesn't necessarily indicate or imply any order in time.

What has been described above includes examples of one or more embodiments of the disclosure. It is, of course, not possible to describe every conceivable combination of components or methodologies for purposes of describing these examples, and it can be recognized that many further combinations and permutations of the present embodiments are possible. Accordingly, the embodiments disclosed and/or claimed herein are intended to embrace all such alterations, modifications and variations that fall within the spirit and scope of the detailed description and the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:
1. A device, comprising:
a first conductive layer;
a second conductive layer;
one or more first electrodes embedded in the first conductive layer;
two or more second electrodes embedded in the second conductive layer;
a sensing circuit connected to each of the one or more first electrodes and at least one of the two or more second electrodes; and a voltage source connected to at least one electrode of the two or more second electrodes, wherein the one or more first electrodes and the two or more second electrodes form at least a portion of a bridge structure that exhibits an electrical property as measured by the sensing circuit in response to application of the voltage source connected to the at least one electrode of the two or more second electrodes, and wherein the electrical property varies as a function of misalignment of the first conductive layer and the second conductive layer in an in-plane direction.

2. The device of claim 1, further comprising an intermediate layer having a first surface situated adjacent to a first surface of the first conductive layer and a second surface opposite to the first surface of the intermediate layer, wherein the second conductive layer has a first surface situated adjacent to the second surface of the intermediate layer.

3. The device of claim 2, wherein the intermediate layer is a nonconductive layer.

4. The device of claim 3, wherein the intermediate layer comprises an air gap.

5. The device of claim 3, wherein the intermediate layer comprises a dielectric material.

6. The device of claim 3, wherein:
the one or more first electrodes comprise one first electrode;
the two or more second electrodes comprise two second electrodes; and
the first electrode and the second electrodes form a capacitive half-bridge structure that exhibits an electrical charge that varies as the function of the misalignment of the first conductive layer and the second conductive layer in the in-plane direction.

7. The device of claim 6, wherein:
the voltage source is a time-varying voltage source connected to a first electrode of the two second electrodes; and
the sensing circuit is a single-ended sensing circuit.

8. The device of claim 7, wherein:
the first electrode is connected to an input position of the single-ended sensing circuit; and
a second electrode of the two second electrodes, distinct from the first electrode of the two second electrodes, is connected to a feedback position of the single-ended sensing circuit.

9. The device of claim 3, wherein:
the one or more first electrodes comprise two first electrodes;
the two or more second electrodes comprise two second electrodes; and
the first electrodes and the second electrodes form a capacitive half-bridge structure that exhibits an electrical charge that varies as the function of the misalignment of the first conductive layer and the second conductive layer in the in-plane direction.

10. The device of claim 9, wherein:
the voltage source is a first time-varying voltage source connected to a first electrode of the two second electrodes;
the device further comprises a second time-varying voltage source connected to a second electrode of the two second electrodes that is distinct from the first electrode of the two second electrodes; and
the sensing circuit is a differential sensing circuit.

11. The device of claim 10, wherein:
the two first electrodes are connected to respective feedback positions of the differential sensing circuit; and
the two second electrodes are connected to respective input positions of the differential sensing circuit.

12. The device of claim 3, wherein:
the one or more first electrodes comprise two first electrodes;
the two or more second electrodes comprise three second electrodes; and
the first electrodes and the second electrodes form a capacitive half-bridge structure that exhibits an electrical charge that varies as the function of the misalignment of the first conductive layer and the second conductive layer in the in-plane direction.

13. The device of claim 12, wherein:
the voltage source is a time-varying voltage source connected to a first electrode of the three second electrodes; and
the sensing circuit is a differential sensing circuit.

14. The device of claim 13, wherein:
the first electrodes are connected to respective input positions of the differential sensing circuit;
a second electrode of the three second electrodes, distinct from the first electrode of the three second electrodes, is connected to a feedback position of the differential sensing circuit; and
a third electrode of the three second electrodes, distinct from the first electrode of the three second electrodes and the second electrode of the three second electrodes, is connected to the feedback position of the differential sensing circuit.

15. The device of claim 13, wherein:
the first electrodes are connected to respective feedback positions of the differential sensing circuit;
a second electrode of the three second electrodes, distinct from the first electrode of the three second electrodes, is connected to an input position of the differential sensing circuit; and
a third electrode of the three second electrodes, distinct from the first electrode of the three second electrodes and the second electrode of the three second electrodes, is connected to the input position of the differential sensing circuit.

16. The device of claim 2, wherein:
the intermediate layer is a conductive layer;
the one or more first electrodes comprise two first electrodes;
the two or more second electrodes comprise two second electrodes; and
the first electrodes and the second electrodes form a resistive half-bridge structure that exhibits an electrical conductance that varies as the function of the misalignment of the first conductive layer and the second conductive layer in the in-plane direction.

17. The device of claim 16, wherein:
the voltage source is a direct current voltage source having a first pole connected to a first electrode of the two first electrodes and a second pole connected to a second electrode of the two first electrodes that is distinct from the first electrode of the two first electrodes; and
the sensing circuit is a differential sensing circuit.

18. The device of claim 17, wherein:
the two first electrodes are connected to respective input positions of the differential sensing circuit; and the two second electrodes are connected to respective feedback positions of the differential sensing circuit.

19. The device of claim 1, wherein at least one of the first conductive layer or the second conductive layer is a micro-electro-mechanical systems (MEMS) layer.

20. The device of claim 1, wherein at least one of the first conductive layer or the second conductive layer is a complementary metal-oxide-semiconductor (CMOS) die layer associated with the device.

* * * * *